(12) United States Patent
Nakahama

(10) Patent No.: US 7,568,519 B2
(45) Date of Patent: Aug. 4, 2009

(54) COOLING DEVICE FOR HEAT SOURCE

(75) Inventor: Takafumi Nakahama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/260,273

(22) Filed: Oct. 28, 2005

(65) Prior Publication Data

US 2006/0048918 A1    Mar. 9, 2006

Related U.S. Application Data

(62) Division of application No. 10/067,992, filed on Feb. 8, 2002, now abandoned.

(30) Foreign Application Priority Data

Feb. 9, 2001    (JP) ............................. 2001-033916

(51) Int. Cl.
*F28F 7/00* (2006.01)
*H05K 7/20* (2006.01)
(52) U.S. Cl. .................. 165/80.4; 165/104.33
(58) Field of Classification Search ............... 165/80.4, 165/104.33, 185, 908; 257/714, 721; 361/689, 361/692, 699

See application file for complete search history.

(56) References Cited

U.S. PATENT DOCUMENTS

| 3,361,195 | A | * | 1/1968 | Motto, Jr. et al. | ......... 165/80.4 |
|---|---|---|---|---|---|
| 5,016,090 | A | | 5/1991 | Galyon et al. | |
| 5,023,695 | A | * | 6/1991 | Umezawa et al. | ............ 257/714 |
| 5,239,443 | A | | 8/1993 | Fahey et al. | |
| 5,263,536 | A | | 11/1993 | Hulburd et al. | |
| 5,270,572 | A | | 12/1993 | Nakajima et al. | |
| 5,316,075 | A | * | 5/1994 | Quon et al. | ................. 165/80.4 |
| 5,436,501 | A | * | 7/1995 | Ikeda | ......................... 257/714 |
| 5,467,815 | A | * | 11/1995 | Haumann et al. | ......... 165/109.1 |
| 5,604,665 | A | * | 2/1997 | Chrysler et al. | ............. 361/703 |
| 5,631,676 | A | | 5/1997 | Karz | |
| 5,841,634 | A | * | 11/1998 | Visser | ......................... 361/699 |
| 6,341,485 | B1 | * | 1/2002 | Liebe | .......................... 60/772 |
| 6,397,936 | B1 | | 6/2002 | Crowley et al. | |

FOREIGN PATENT DOCUMENTS

| EP | 0 673 066 A1 | 9/1995 |
|---|---|---|
| JP | 10-022428 A | 1/1998 |

* cited by examiner

*Primary Examiner*—Thov Duong
(74) *Attorney, Agent, or Firm*—Foley & Lardner LLP

(57) ABSTRACT

In a cooling device for a heat source according to the present invention, header is arranged on the downstream side of an inlet port i.e. on the side of holes opposite to that of the heat source, a heat source is arranged on the outside face of a heat sink and holes are provided that spray fluid towards the back face of the heat sink, outlet ports being provided fewer than the number of holes. Thanks to the arrangement of header on the side of holes opposite to that of the heat source, no large differences are generated in the flow rate of the holes; thus, the heat conduction rate when the flow from holes collides with the back face of the heat sink is practically uniform and the cooling performance of the heat sink, with which the flow collides, at the back of the heat source is practically uniform.

3 Claims, 17 Drawing Sheets

COOLING DEVICE FOR HEAT SOURCE

CROSS-REFERENCE TO RELATED APPLICATION

The present application is a divisional of U.S. application Ser. No. 10/067,992, filed Feb. 8, 2002, the entire contents of which is incorporated herein by reference.

This application claims benefit of priority to Japanese application number JP 2001-33916 filed Feb. 9, 2001, the entire content of which is incorporated by reference herein.

BACKGROUND OF THE INVENTION

1. Field of the Invention

The present invention relates to a cooling device for a heat source that cools a heat source such as a semiconductor element.

2. Description of the Related Art

FIG. 1 shows cross-sectional views of a prior art cooling device for a heat source, FIG. 1A being a c cross-section, FIG. 1B being an a cross-section and FIG. 1C being a b cross-section.

In FIG. 1A to C, 1 are heat sources such as semiconductor elements, 2 is a heat sink, 3 are holes, 4 are headers, 5 is an inlet port, 6 is an outlet port, 7a is an inlet-side flow path, and 7b is an outlet-side flow path; cooling medium (hereinbelow "fluid") entering from inlet port 5 passes through outlet-side flow path 7a and collides with the wall face of heat sink 2 where the heat sources are arranged from headers 4 from holes 3 and then flows through outlet-side flow path 7b and is discharged from outlet port 6. The arrows indicate the flow of the fluid.

The heat that is generated in the heat source is transmitted to heat sink 2 by thermal conduction and is transmitted to the fluid flowing out from holes 3 by thermal conduction. In this process, the cooling performance is raised by the fact that the rate of heat conduction (so-called, heat condition rate) is increased since the fluid, rather than merely flowing, collides with the heat sink as a spray from holes 3.

Also, although, in the case of a channel-type heat sink, there is considerable pressure loss since the fluid passes through narrow channels, with the spray system using holes, pressure loss is smaller than in the case of channels, so the cooling performance is higher.

However, with the conventional cooling device for a heat source, although the fluid is guided from the inlet port to the respective holes by inlet-side flow path 7a, there are considerable differences in the liquid frictional resistance between the respective flow paths, with the result that the flow rate from the holes is uneven, producing local differences in cooling performance.

A further problem is that, although the pressure loss is less than in the case of the channel type, the pressure loss may still not necessarily be capable of being described as small; this inevitably lowers the flow rate, due to limitations on the cooling liquid circulation pump and so lowers the cooling performance.

SUMMARY OF THE INVENTION

Accordingly one object of the present invention is to provide a novel cooling device for a heat source wherein the above problems are solved and a practically uniform cooling performance can be achieved with little loss of pressure.

In order to achieve this object, a cooling device for a heat source according to the present invention is constructed as follows.

Specifically, a cooling device for a heat source comprises:
a heat sink with a heat source arranged on its outer surface and a plurality of holes provided at its back surface;
a header arranged on the side of the holes arranged in this heat sink opposite to that of the heat source;
an inlet port at which coolant flows into said header; and
an outlet port at which coolant in the heat sink flows out.

Thus, by arranging a header at the side of the holes opposite the heat source, pressure loss becomes smaller than in the case of the prior art in which fluid was fed to the holes by a flow path from an inlet port and practically uniform flow can be achieved without generating large differences in the flow rate of the plurality of holes.

Also, the following construction is provided. Specifically, a cooling device for a heat source comprises:

(1) a heat sink incorporating coolant, this heat sink comprising:
(a) a first heat sink member with a heat source arranged at its outer surface; and
(b) a second heat sink member provided with holes, the coolant that cools the heat source being made to pass through these holes;

(2) a header arranged on the opposite side to that of the first heat sink member about the second heat sink member as axis;

(3) an inlet port whereby the coolant is made to flow into a space surrounded by the header and the second heat sink member; and (4) an outlet port whereby coolant in the space surrounded by said first heat sink member and second heat sink member is made to flow out.

BRIEF DESCRIPTION OF THE DRAWINGS

A more complete appreciation of the present invention and many of the attendant advantage thereof will be readily obtained as the same becomes better understood by reference to the following detailed description when considered in connection with the accompanying drawings, wherein:

FIGS. 5A through 5C show cross-sectional views of a cooling device for a heat source according to a fourth embodiment of the present invention;

DETAILED DESCRIPTION OF THE PREFERRED EMBODIMENTS

Figure 1A:
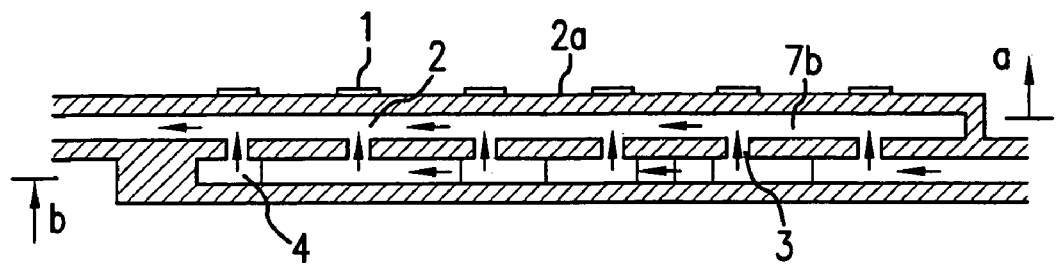
FIGS. 1A through 1C show cross-sectional views of a prior art cooling device for a heat source.
Figure 1B:
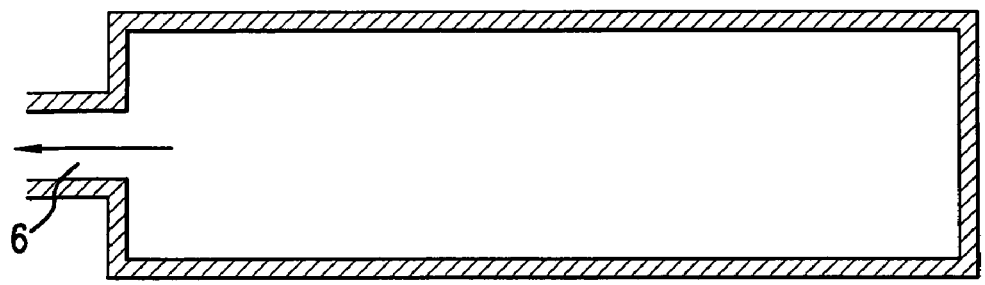
Figure 1C:
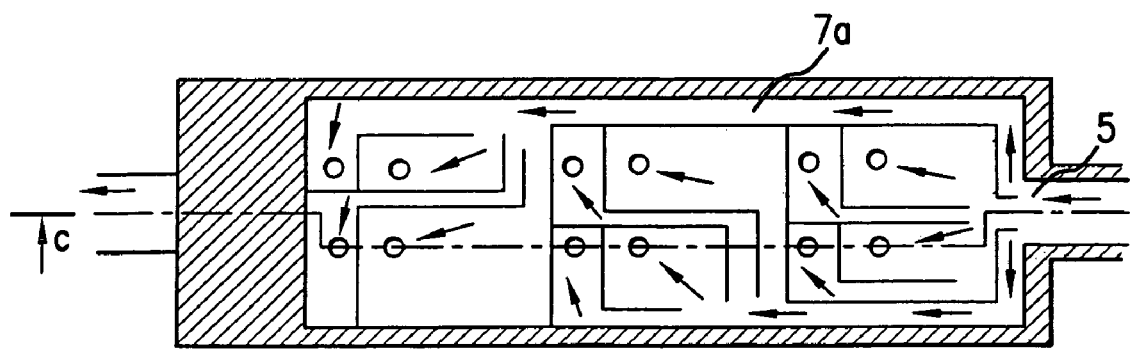

Referring now to the drawings, wherein like reference numerals designate identical or corresponding parts throughout the several views, and more particularly to FIG. 2 thereof, one embodiment of the present invention will be described.

Figure 2A:
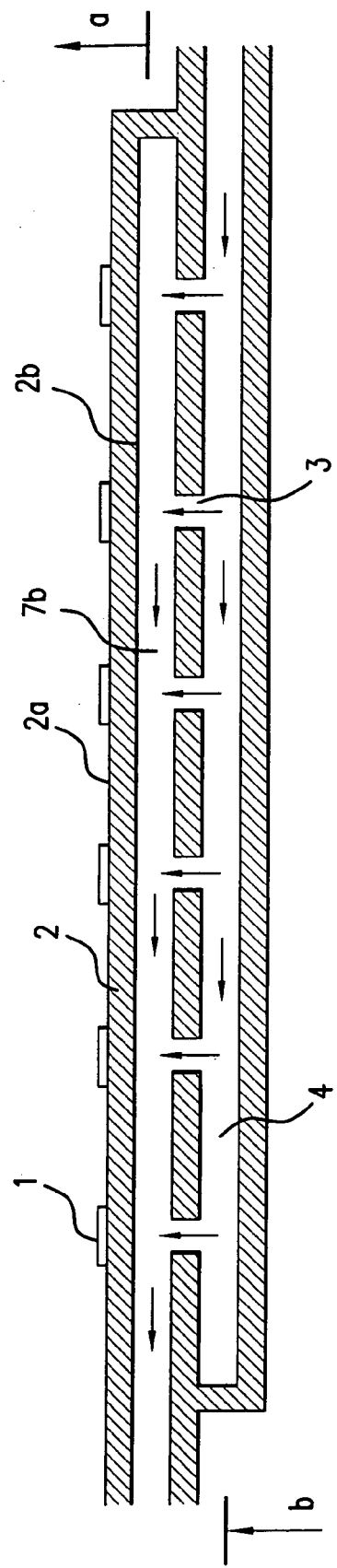
FIGS. 2A through 2C show cross-sectional views of a cooling device for a heat source according to a first embodiment of the present invention.
Figure 2B:
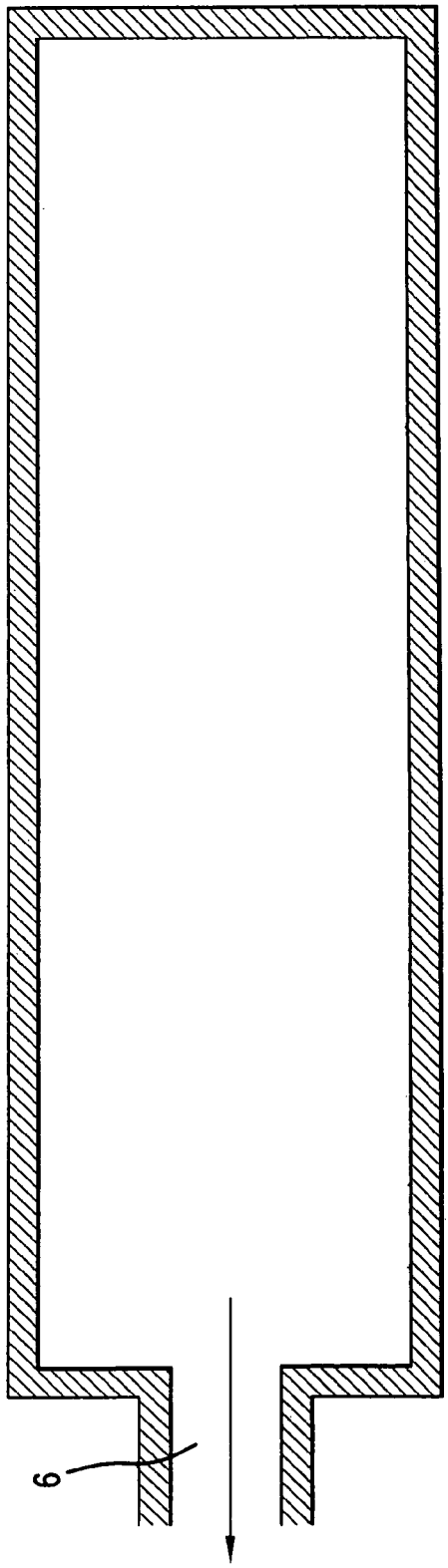
Figure 2C:
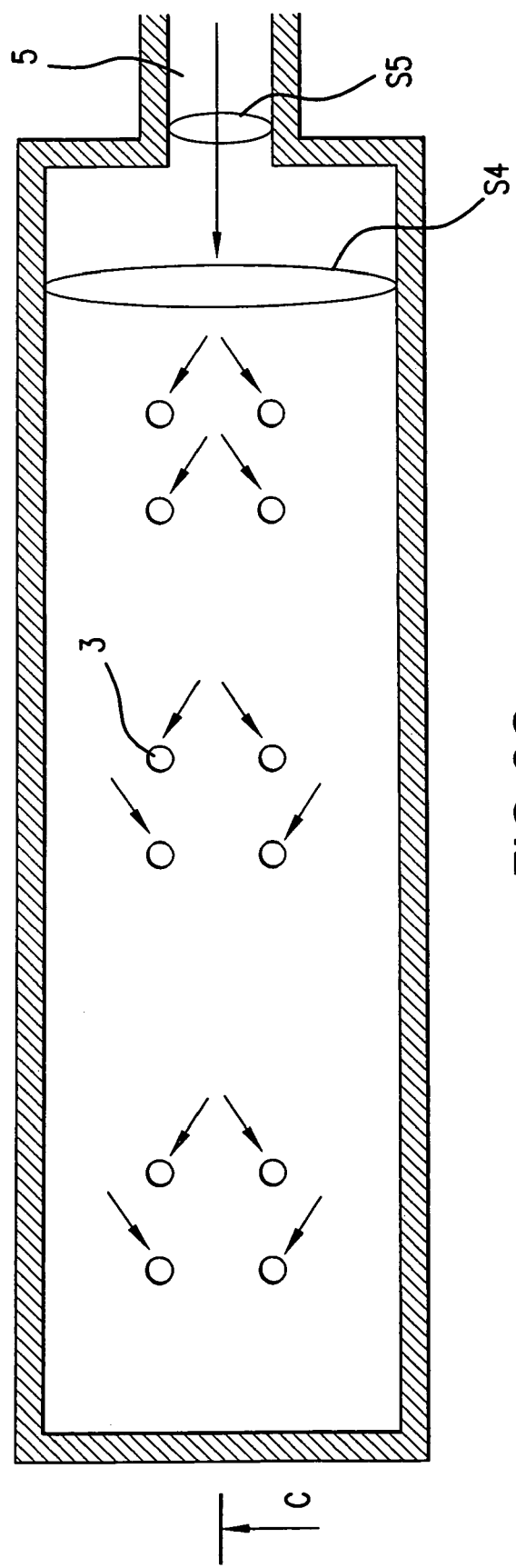

FIG. 2 shows cross-sectional views of a cooling device for a heat source according to a first embodiment of the present invention, FIG. 2A being a c cross-section, FIG. 2B being an a cross-section and FIG. 2C being a b cross-section.

In FIG. 2A to C, 1 are heat sources such as semiconductor elements, 2 is a heat sink (more precisely, a first heat sink member constituting a heat sink), 3 are holes (more precisely, these holes are provided in a second heat sink member constituting the heat sink), 4 is a header, 5 is an inlet port, 6 is an outlet port, and 7b is an outlet-side flow path; header 4 is arranged on the downstream side of inlet port 5 i.e. on the opposite side of holes 3 to that of the heat sources (on the opposite side to heat sources 2a, regarding the body of heat sink 2 as the center); heat sources 1 are arranged on the surface 2a of heat sink 2 and a plurality of holes 3 are provided that spray fluid towards the rear face 2b of heat sink 2; and there is provided an outlet port 6 (in this embodiment, a single one on the opposite side to that of inlet port 5) of number fewer than the number of holes 3.

Furthermore, the cross sectional area S4 of header 4 is made considerably larger than the cross-sectional area S5 of inlet port 5 (S4>>S5).

Also, the header cross-sectional area in the hole inlet direction is made considerably larger than the cross-sectional area of a single hole.

In this way, by arranging the headers on the opposite side of holes 3 to that of the heat sources, a practically uniform flow is obtained without generating large differences in the flow rate of the plurality of holes 3, and the pressure loss is smaller than that in the conventional arrangement, in which the fluid was fed in a flow path from the inlet port. In this way, the rate of heat conduction when the flow from holes 3 collides with the back surface 2b of the heat sink becomes practically uniform (flow rate of the coolant colliding therewith is uniform), so the cooling performance of the heat sink, with which the flow collides, at the back of the heat sources becomes practically uniform.

Thus, the fluid resistance from inlet port 5 to the respective holes 3 can be reduced by the provision of header 4.

As depicted in FIG. 2C, the plurality of holes may comprise a first hole, a second hole and a third hole arranged in sequence along a line without intervening holes and wherein the distance between the first hole and the second hole is different than the distance between the second hole and the third hole.

Next, a second embodiment of the present invention will be described with reference to FIG. 3. Description of parts which are identical with those of the first embodiment is omitted; only the parts which are different are described.

Figure 3A:
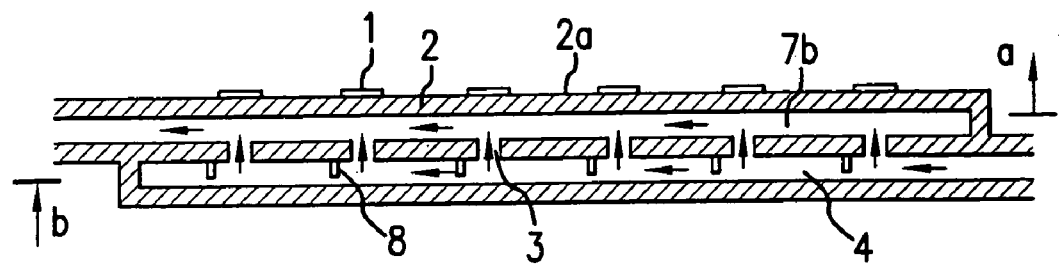
FIGS. 3A through 3C show cross-sectional views of a cooling device for a heat source according to a second embodiment of the present invention.
Figure 3B:
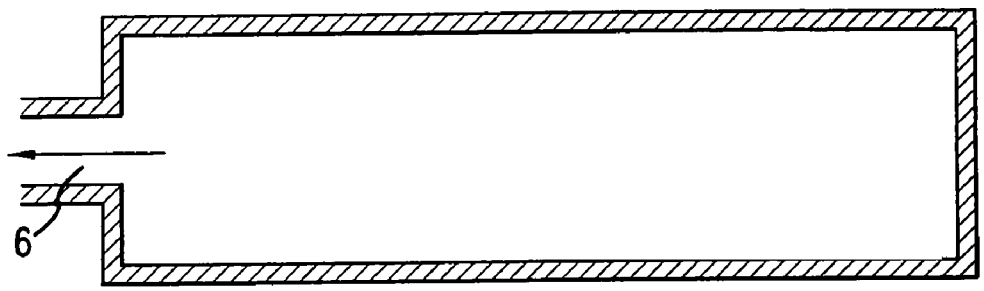
Figure 3C:
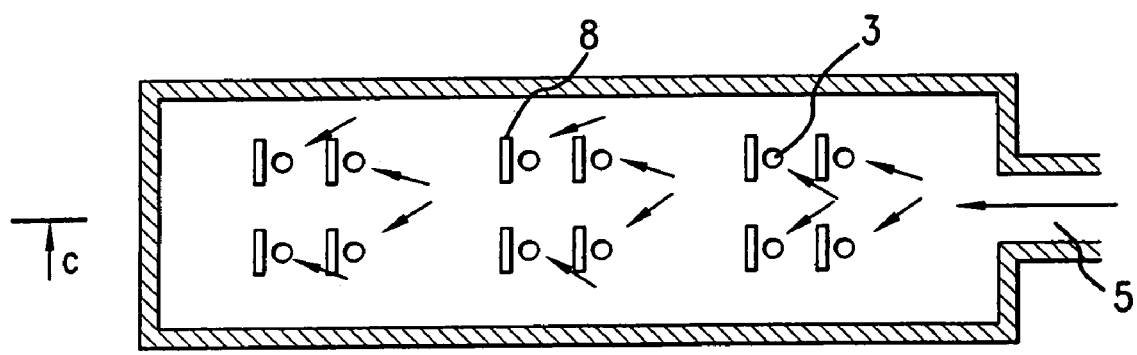

FIG. 3 shows cross-sectional views of a cooling device for a heat source according to a second embodiment, FIG. 3A being a c cross-section, FIG. 3B being an a cross-section and FIG. 3C being a b cross-section. The difference with respect to the first embodiment illustrated in FIG. 2 lies in the provision of upright plates 8 on the downstream side of the holes 3 of header 4.

If there are no upright plates 8, the flow is branched into downstream side flow and flow towards the holes, so branching loss is produced and the flow rate to the holes becomes somewhat smaller than the mean flow rate obtained by dividing the total flow rate by the number of holes.

Thanks to the provision of upright plates 8 surrounding holes 3, the flow entering holes 3 from header 4 cannot be affected by branching loss produced by flow towards the further downstream side of the holes, so the pressure on the upstream side of the holes is raised and the flow rate to holes 3 becomes practically uniform; thus, in the same way as in the first embodiment, the heat conduction rate of the plurality of parts with which the flow collides becomes practically uniform, with the result that the cooling performance of the heat sink, with which the flow collides, at the back of the heat sources becomes practically uniform.

Next, a third embodiment of the present invention is described with reference to FIG. 4. Description of parts which are the same as in the case of the second embodiment is omitted and only parts which are different are described.

Figure 4A:
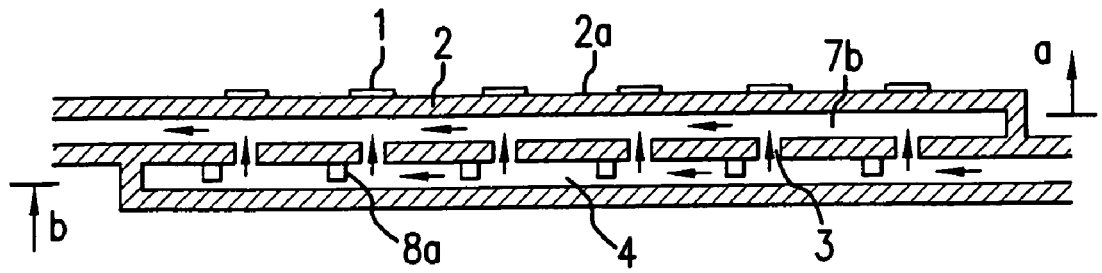
FIGS. 4A through 4C show cross-sectional views of a cooling device for a heat source according to a third embodiment of the present invention.
Figure 4B:
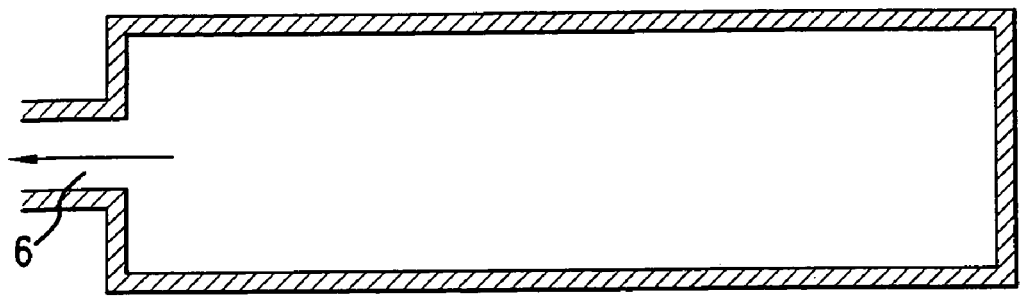
Figure 4C:
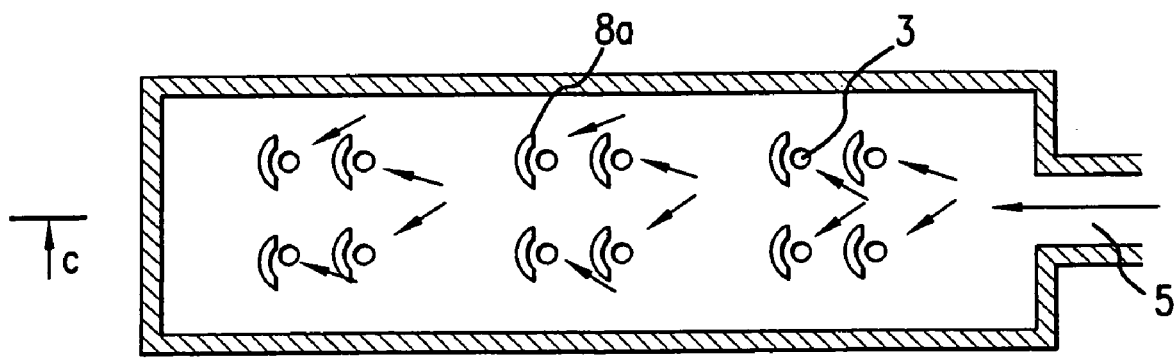

FIG. 4 shows cross-sectional views of a cooling device for a heat source according to a third embodiment, FIG. 4A being a c cross-section, FIG. 4B being an a cross-section, and FIG. 4C being a b cross-section; the difference from the second embodiment shown in FIG. 3 lies in that upright plates arranged on the downstream side of holes 3 of header 4 are constituted as arcuate upright plates 8a so as to surround holes 3.

In this way, the pressure on the upstream side of upright plates 8a i.e. in the vicinity of holes 3 becomes higher than in the case of the second embodiment so the flow enters even more smoothly into holes 3 with the result that the flow rate into the holes becomes practically equal to the mean flow rate; thus, in the same way as in the second embodiment, the heat conduction rates of the plurality of parts with which the flow collides become practically equal, so the cooling performance of the heat sink, with which the flow collides, at the back of the heat sources becomes practically uniform.

Next, a fourth embodiment of the present invention will be described with reference to FIG. 5. Description of parts which are the same as in the case of the second embodiment is omitted and only parts which are different are described.

Figure 5A:
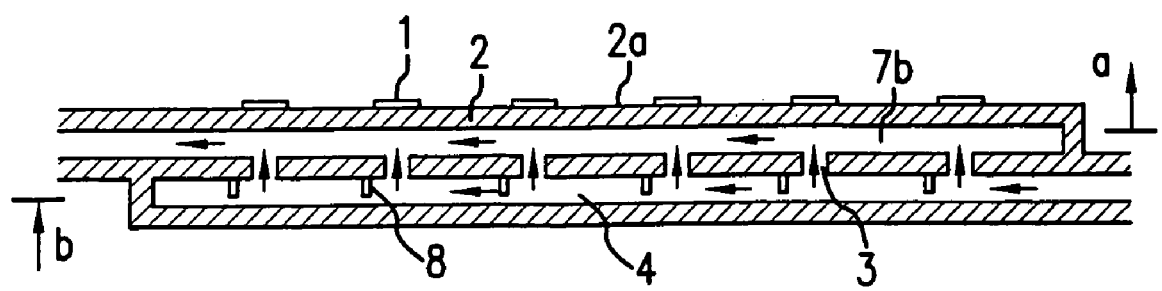
Figure 5B:
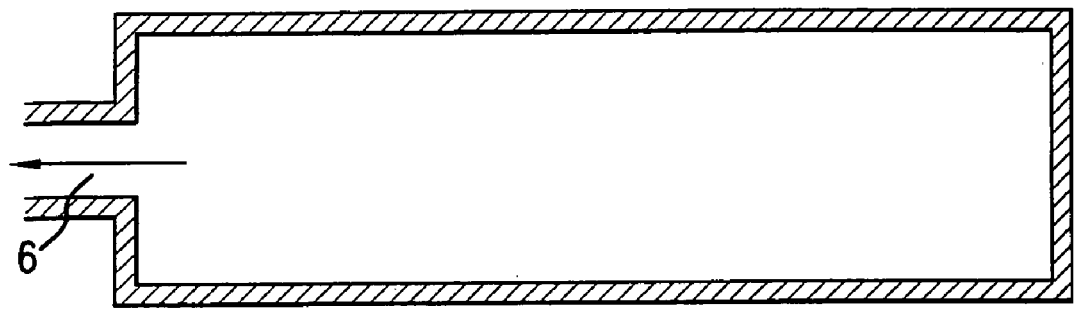

FIG. 5 shows cross-sectional views of a cooling device for a heat source according to a fourth embodiment, FIG. 5A being a c cross-section, FIG. 5B being an a cross-section, and FIG. 5C being a b cross-section; the difference from the second embodiment shown in FIG. 3 lies in that upright plates arranged on the downstream side of holes 3 of header 4 are provided offset from the centers of holes 3.

In this way, since the slipstream zone of a hole 3 is offset from a hole 3b on the downstream side thereof, it becomes easier for fluid to flow into such a hole 3b on the downstream side; this makes it possible to reduce the difference of inflow for each hole; thus, in the same way as in the second embodiment, the heat conduction rates of the plurality of parts with which the flow collides become practically equal, so the cooling performance of the heat sink, with which the flow collides, at the back of the heat-generating becomes practically uniform.

Figure 6A:
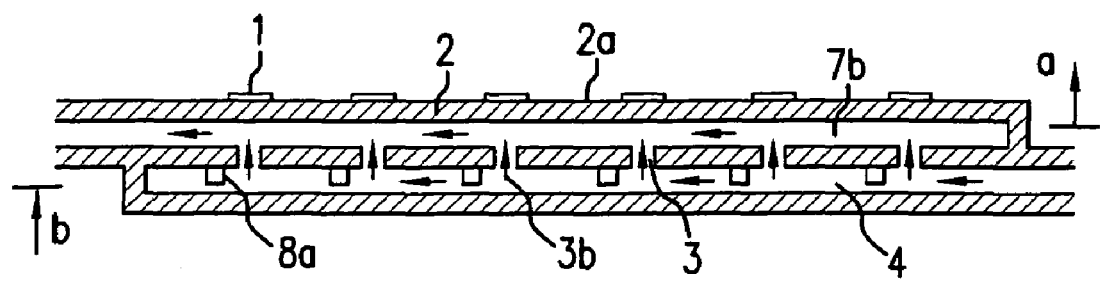
FIGS. 6A through 6C show cross-sectional views of a cooling device for a heat source according to a fifth embodiment of the present invention.
Figure 6B:
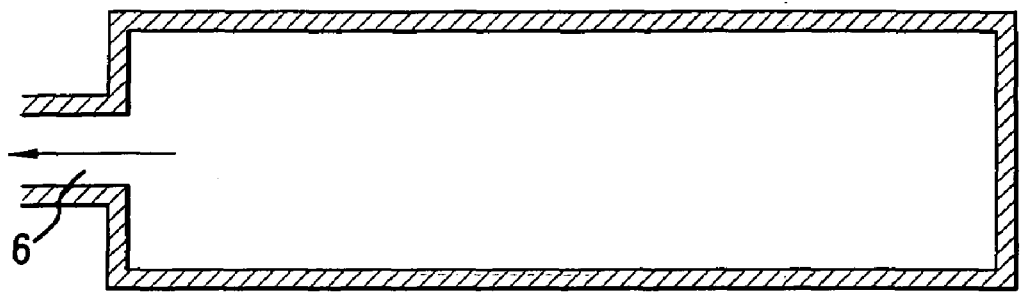
Figure 6C:
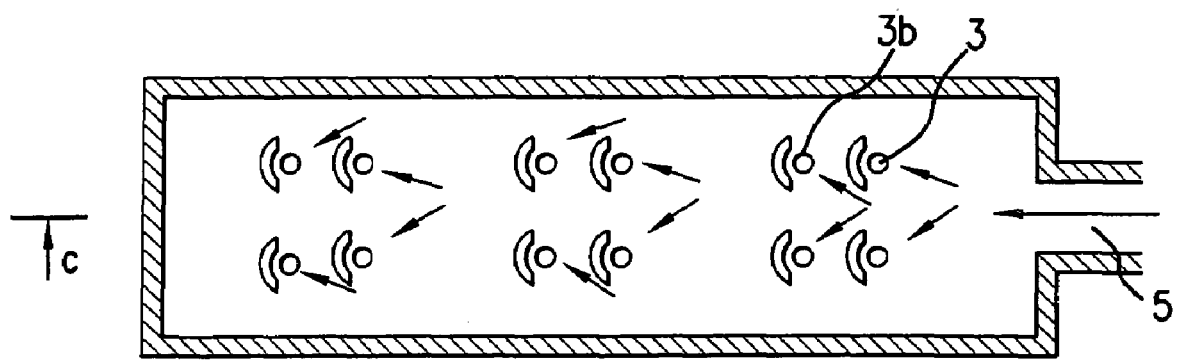

FIG. 6 shows cross-sectional views of a cooling device for a heat source according to a fifth embodiment, FIG. 6A being a c cross-section, FIG. 6B being an a cross-section, and FIG. 6C being a b cross-section; the difference from the fourth embodiment shown in FIG. 5 lies in that the upright plates which are provided on the downstream side are offset from the centers of holes 3 of header 4 are formed as upright plates 8b of arcuate shape such as to surround holes 3.

In this way, the flow from the upstream side flows along the downstream-side side faces of arcuate upright plates 8b, resulting in a reduction in the size of the slipstream zone; since the slipstream zone is offset from the holes on the downstream side, it becomes easier for fluid to flow into holes on the downstream side so the flow rate into the holes becomes a practically uniform flow rate; thus, in the same way as in the fourth embodiment, the heat conduction rates of the plurality of parts with which the flow collides become practically equal, so the cooling performance of the heat sink, with which the flow collides, at the back of the heat sources becomes practically uniform.

Next, a sixth embodiment of the present invention will be described with reference to FIG. 7. Description of parts which are the same as in the case of the second embodiment is omitted and only parts which are different are described.

Figure 7A:
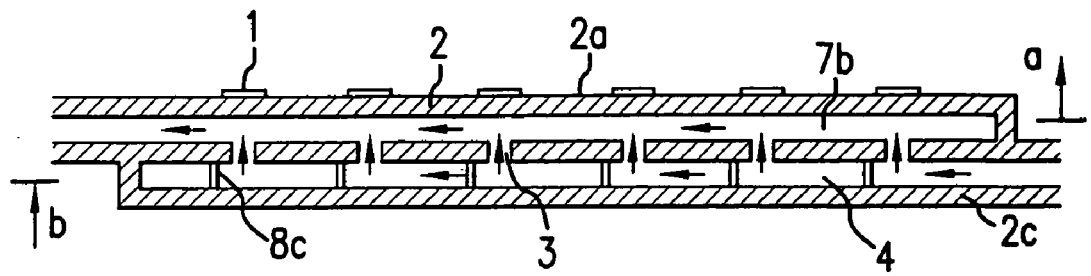
FIGS. 7A through 7C show cross-sectional views of a cooling device for a heat source according to a sixth embodiment of the present invention.
Figure 7B:
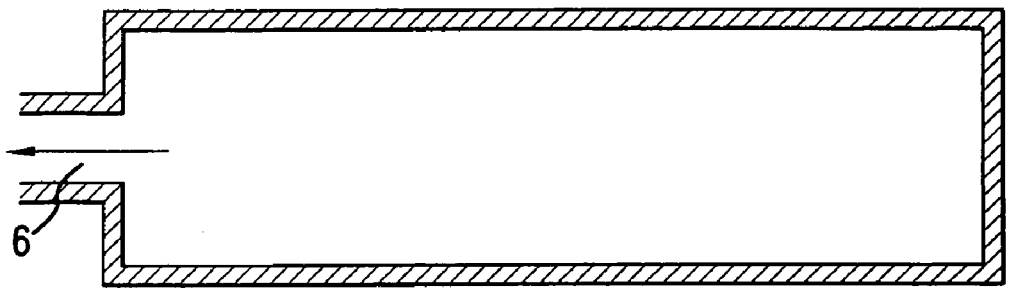
Figure 7C:
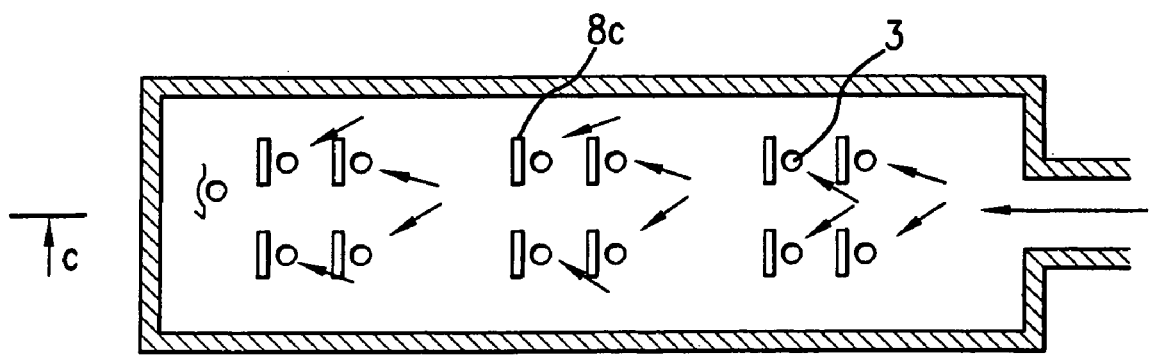

FIG. 7 shows cross-sectional views of a cooling device for a heat source according to a sixth embodiment, FIG. 7A being a c cross-section, FIG. 7B being an a cross-section, and FIG. 7C being a b cross-section; the difference from the second embodiment shown in FIG. 3 lies in that upright plates 8c arranged on the downstream side of holes 3 of header 4 are arranged so as to contact without a gap side wall face 2c of header 4 on the opposite side to the holes.

In this way, the pressure on the upstream side of upright plates 8c i.e. in the vicinity of holes 3 becomes higher than in the case of the second embodiment so the flow enters even more smoothly into holes 3 with the result that the flow rate difference for each hole can be reduced so that just as in the case of the second embodiment, the heat conduction rates of the plurality of parts with which the flow collides become practically equal, so the cooling performance of the heat sink, with which the flow collides, at the back of the heat sources becomes practically uniform.

Next, a seventh embodiment of the present invention is described with reference to FIG. 8. Description of parts which are the same as in the case of the first embodiment is omitted and only parts which are different are described.

Figure 8A:
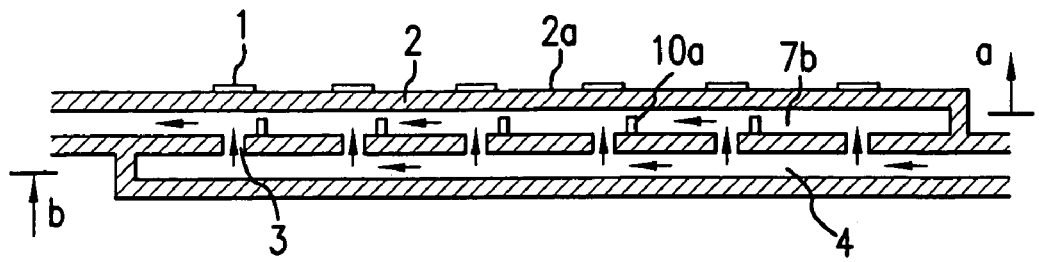
FIGS. 8A through 8C show cross-sectional views of a cooling device for a heat source according to a seventh embodiment of the present invention.
Figure 8B:
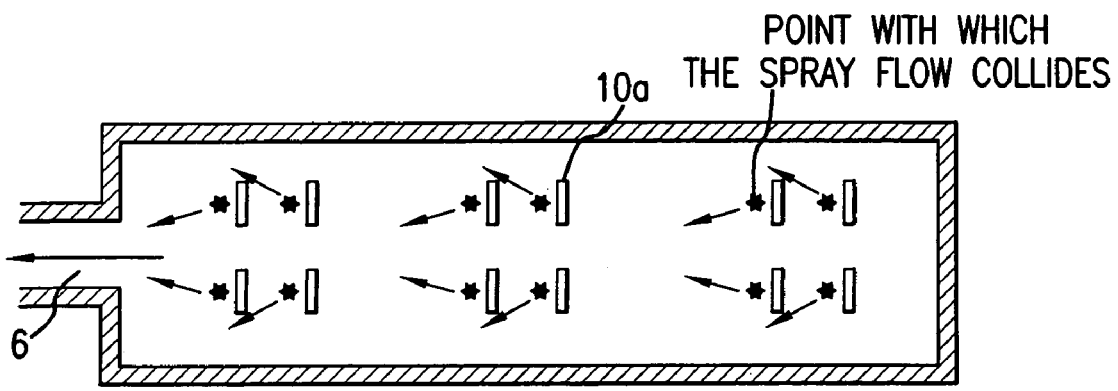
Figure 8C:
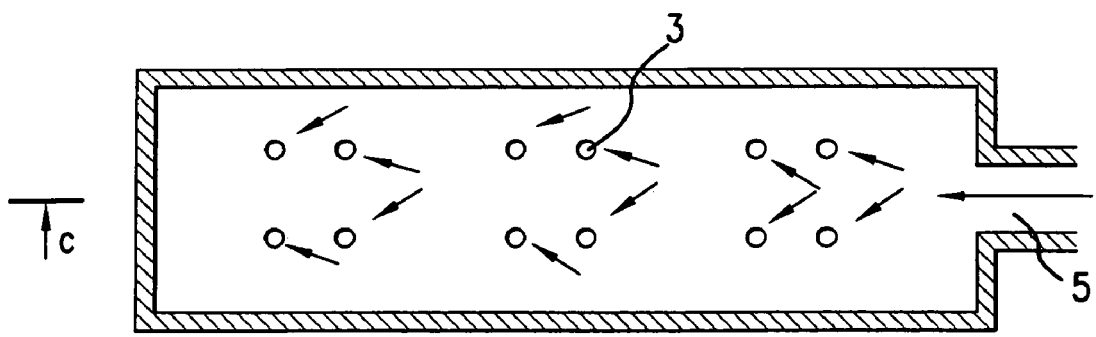

FIG. 8 shows cross-sectional views of a cooling device for a heat source according to a seventh embodiment, FIG. 8A being a c cross-section, FIG. 8B being an a cross-section, and FIG. 8C being a b cross-section; the difference from the first embodiment shown in FIG. 2 lies in that baffle plates 10 are provided on the upstream side of holes 3 of outlet-side flow path 7b.

In this way, flow from the upstream side of outlet-side flow path 7b is divided onto both sides by baffle plates 10 and so interference with the flow flowing out from holes 3 is eliminated.

As a result, the thickness of the boundary layer at sidewall 2b of the jet stream becomes less than in the case of the first embodiment, raising the rate of heat conduction and so making it possible to improve the heat sink cooling performance.

Next, an eighth embodiment of the present invention is described with reference to FIG. 9. Description of parts which are the same as in the case of the seventh embodiment is omitted and only parts which are different are described.

Figure 9A:
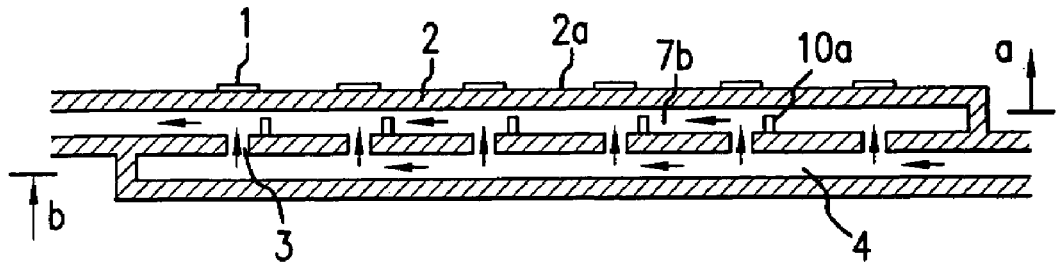
FIGS. 9A through 9C show cross-sectional views of a cooling device for a heat source according to an eighth embodiment of the present invention.
Figure 9B:
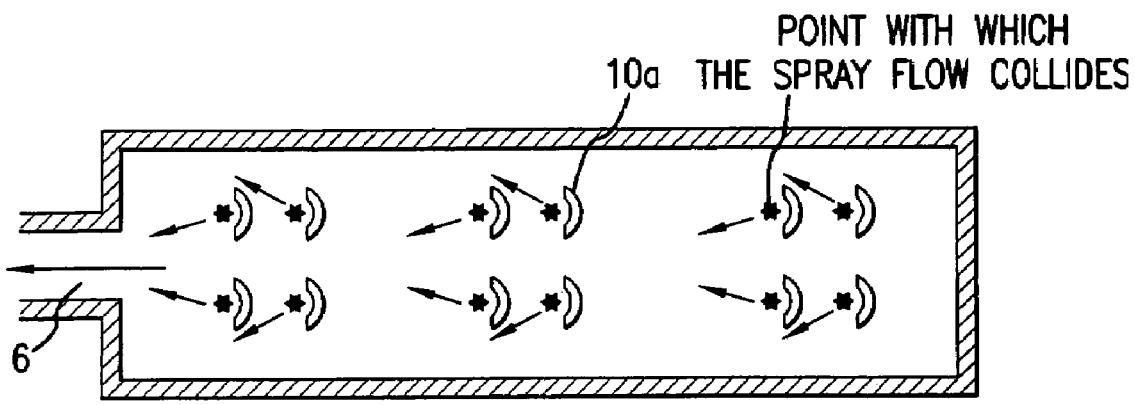
Figure 9C:
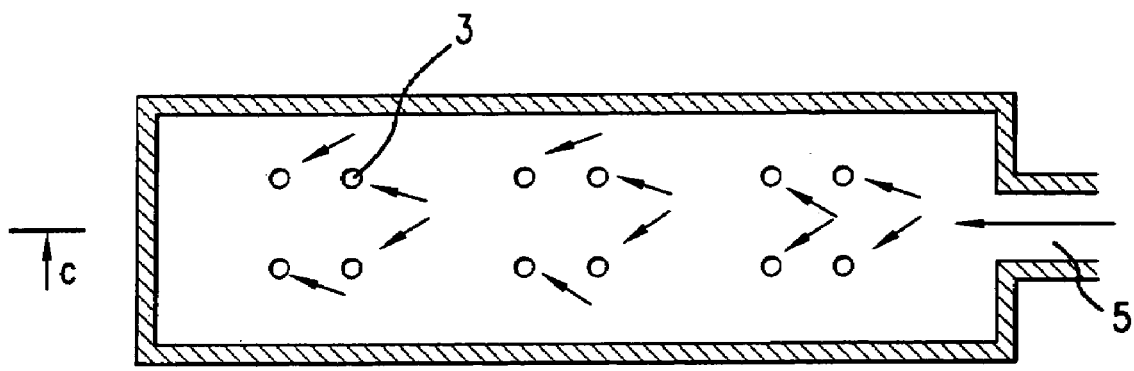

FIG. 9 shows cross-sectional views of a cooling device for a heat source according to an eighth embodiment, FIG. 9A being a c cross-section, FIG. 9B being an a cross-section, and FIG. 9C being a b cross-section; the difference from the seventh embodiment shown in FIG. 8 lies in that the baffle plates that are provided on the upstream side of holes 3 of outlet-side flow path 7b are constituted as upright plates 10a of arcuate shape surrounding holes 3.

As a result, the flow from the upstream side of outlet-side flow path 7b is divided onto both sides by the arcuate baffle plates 10a, so interference with respect of the flow flowing out from holes 3 is eliminated more effectively than in the case of the seventh embodiment, so that the flow becomes smoother on the downstream side.

As a result, the thickness of the boundary layer at sidewall 2b of the jet stream becomes less than in the case of the seventh embodiment, raising the rate of heat conduction and so making it possible to improve the heat sink cooling performance.

Next, a ninth embodiment of the present invention is described with reference to FIG. 10. Description of parts which are the same as in the case of the seventh embodiment is omitted and only parts which are different are described.

Figure 10A:
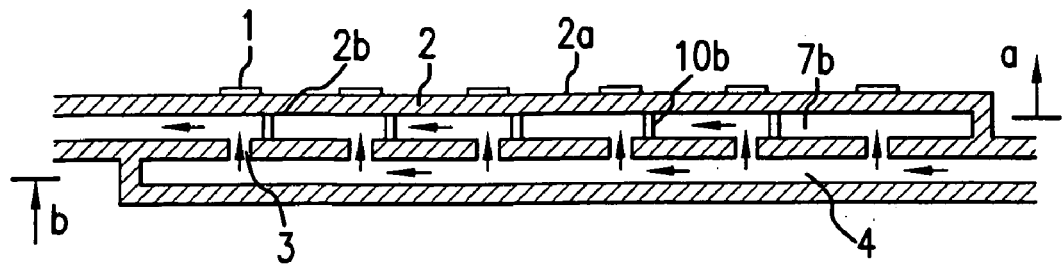
FIGS. 10A through 10C show cross-sectional views of a cooling device for a heat source according to a ninth embodiment of the present invention.
Figure 10B:
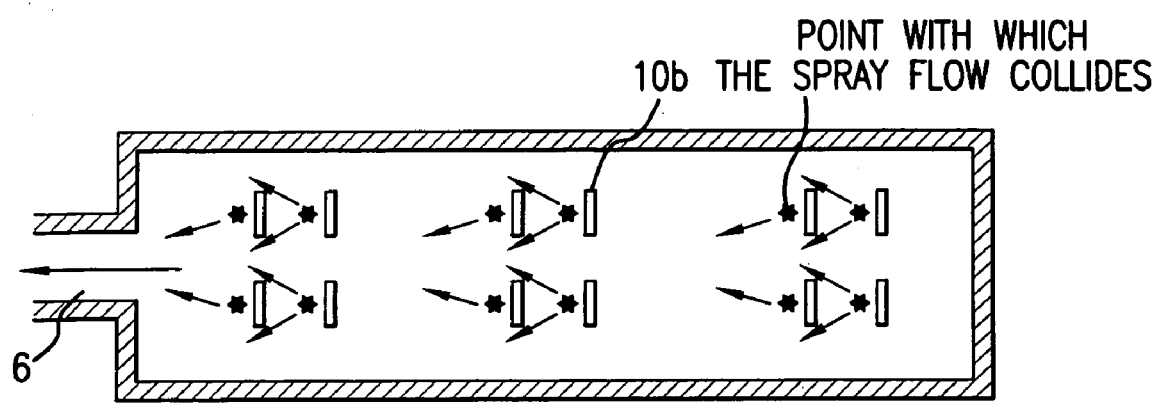
Figure 10C:
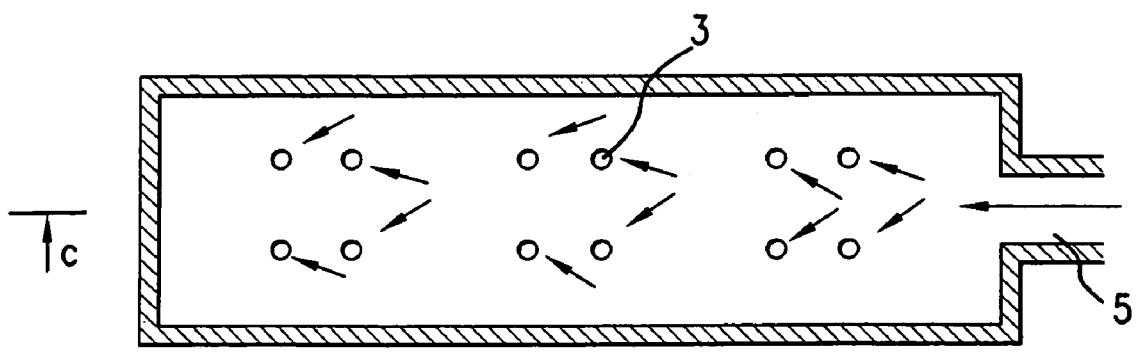

FIG. 10 shows cross-sectional views of a cooling device for a heat source according to a ninth embodiment, FIG. 10A being a c cross-section, FIG. 10B being an a cross-section, and FIG. 10C being a b cross-section; the difference from the seventh embodiment shown in FIG. 8 lies in that the baffle plates 10b that are provided on the upstream side of holes 3 of outlet-side flow path 7b are arranged to contact without a gap the side wall face 2b of outlet-side flow path 7b opposite the holes.

As a result, the flow from the upstream side of outlet-side flow path 7b is divided onto both sides by the baffle plates 10b, so interference with respect of the flow flowing out from holes 3 is eliminated more effectively than in the case of the seventh embodiment, so that the flow becomes smoother on the downstream side.

As a result, the thickness of the boundary layer at sidewall 2b of the jet stream becomes less than in the case of the seventh embodiment, raising the rate of heat conduction and so making it possible to improve the heat sink cooling performance.

Next, a tenth embodiment of the present invention is described with reference to FIG. 11. Description of parts which are the same as in the case of the ninth embodiment is omitted and only parts which are different are described.

Figure 11A:
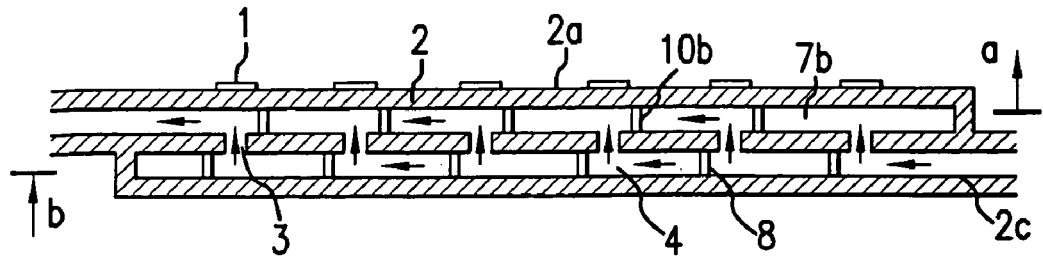
FIGS. 11A through 11C show cross-sectional views of a cooling device for a heat source according to a tenth embodiment of the present invention.
Figure 11B:
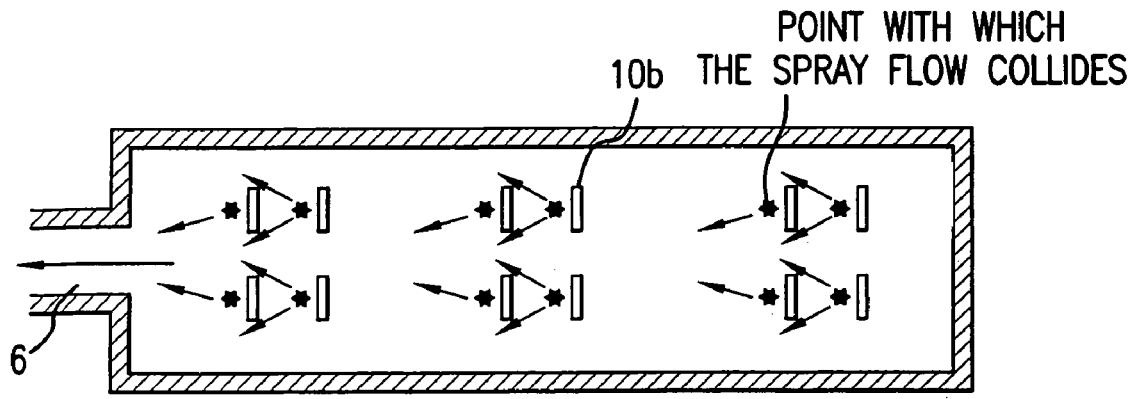
Figure 11C:
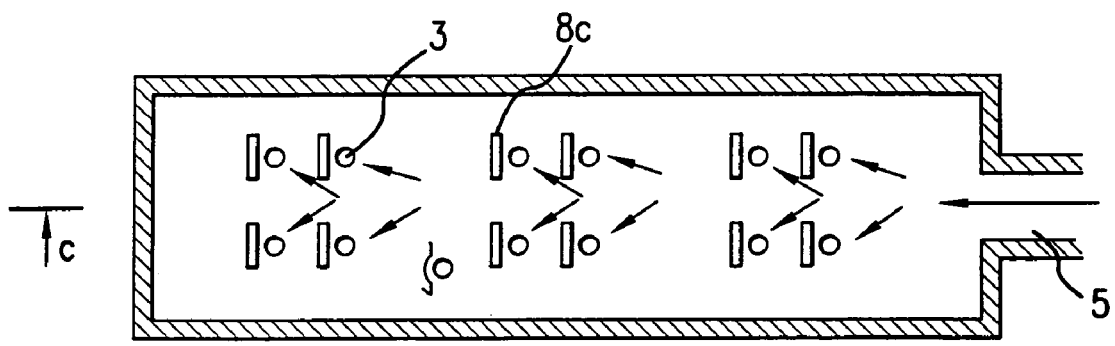

FIG. 11 shows cross-sectional views of a cooling device for a heat source according to a tenth embodiment, FIG. 11A being a c cross-section, FIG. 11B being an a cross-section, and FIG. 11C being a b cross-section; the difference from the ninth embodiment shown in FIG. 10 lies in that, just as in the case of the sixth embodiment, upright plates 8c are arranged so as to contact without a gap side wall face 2c of header 4 on the opposite side to the holes arranged on the downstream side of holes 3 of header 4.

In this way, in the same way as in the case of the sixth embodiment, the pressure on the upstream side of upright plates 8c i.e. in the vicinity of holes 3 becomes higher, with the result that the flow enters even more smoothly into holes 3 and it becomes possible to reduce the difference of flow rates between respective holes; also, just as in the case of the ninth embodiment, the flow from the upstream side of outlet-side flow path 7b is divided onto both sides by baffle plates 10b so that interference with the flow issuing from holes 3 is eliminated and the flow can flow out smoothly on the downstream side. In addition to this, rigidity in the thickness direction of heat sink 2 is improved, making it possible to reduce the amount of deformation of the heat sink that is produced by the heat sources pressing thereon.

As a result, this pressure can be raised, thereby decreasing the contact thermal resistance of the heat sources 1 and heat sink 2, so raising the rate of passage of heat and making it possible to improve the cooling performance of the heat sink.

Next, an eleventh embodiment of the present invention will be described with reference to FIG. 12. Description of parts which are the same as in the case of the tenth embodiment is omitted and only parts which are different are described.

Figure 12A:
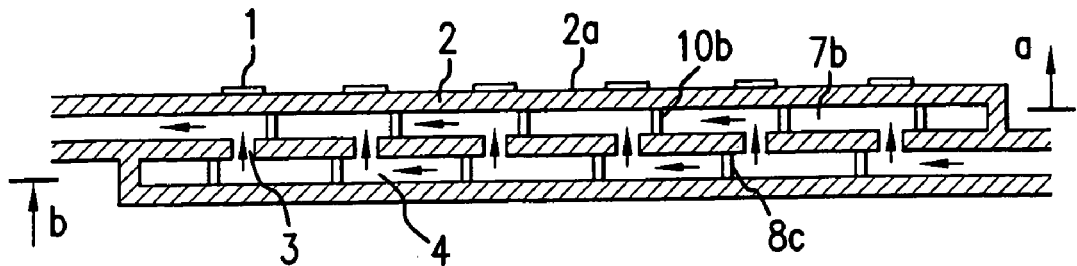
FIGS. 12A through 12C show cross-sectional views of a cooling device for a heat source according to an eleventh embodiment of the present invention.
Figure 12B:
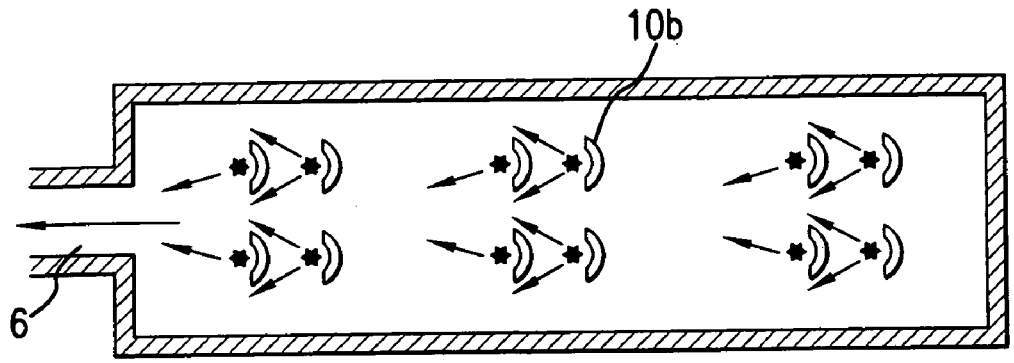
Figure 12C:
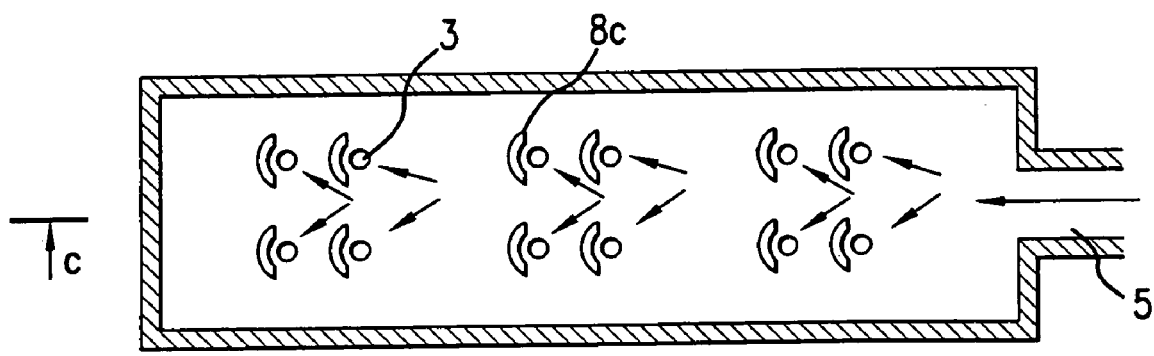

FIG. 12 shows cross-sectional views of a cooling device for a heat source according to an eleventh embodiment, FIG. 12A being a c cross-section, FIG. 12B being an a cross-section, and FIG. 12C being a b cross-section; the difference from the tenth embodiment shown in FIG. 11 lies in that the upright plates and baffle plates are made of arcuate shape surrounding respective holes.

In this way, in the same way as in the case of the sixth embodiment, the pressure on the upstream side of upright plates 8c i.e. in the vicinity of holes 3 becomes higher, with the result that the flow enters even more smoothly into holes 3 and it becomes possible to reduce the difference of flow rates between respective holes; also, just as in the case of the ninth embodiment, the flow from the upstream side of outlet-side flow path 7b is divided onto both sides by baffle plates 10b so that interference with the flow issuing from holes 3 is eliminated and the flow can flow out smoothly on the downstream side. In addition to this, rigidity in the thickness direction of heat sink 2 is improved compared with that in the tenth embodiment, making it possible to reduce the amount of deformation of the heat sink 2 that is produced by the heat sources pressing thereon.

As a result, this pressure can be raised, thereby decreasing the contact thermal resistance of the heat sources 1 and heat sink 2, so raising the rate of passage of heat and making it possible to improve the cooling performance of the heat sink.

Next, a twelfth embodiment of the present invention will be described with reference to FIG. 13. Description of parts which are the same as in the case of the first embodiment is omitted and only parts which are different are described.

Figure 13A:
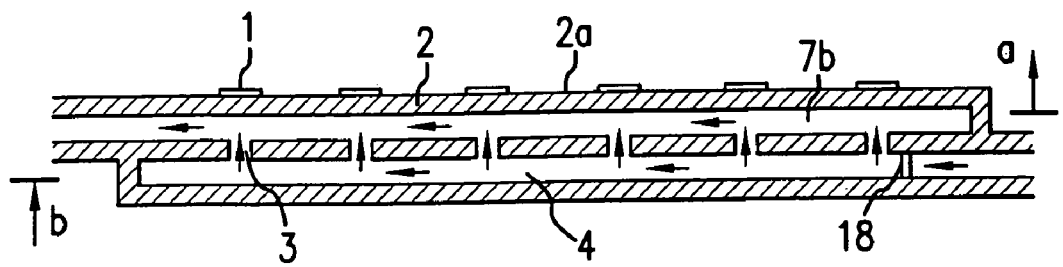
FIGS. 13A through 13C show cross-sectional views of a cooling device for a heat source according to a twelfth embodiment of the present invention.
Figure 13B:
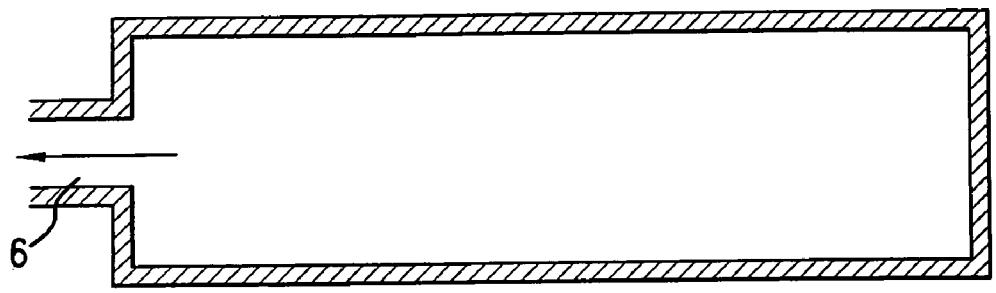
Figure 13C:
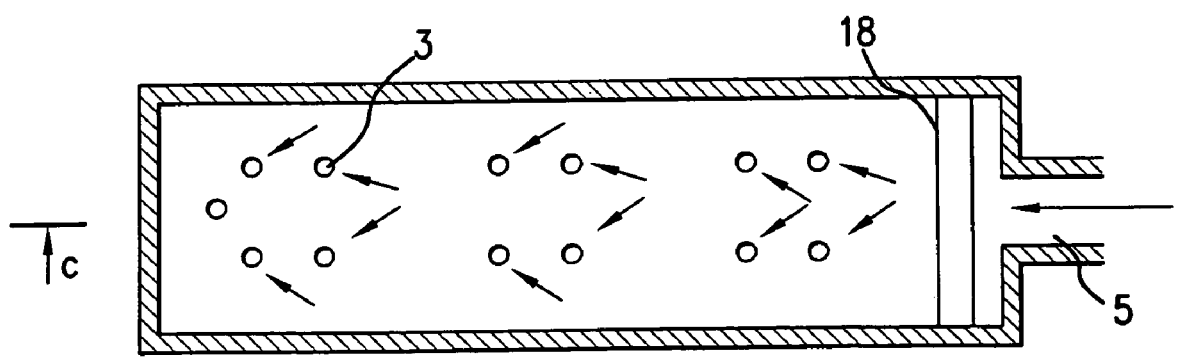

FIG. 13 shows cross-sectional views of a cooling device for a heat source according to a twelfth embodiment, FIG. 13A being a c cross-section, FIG. 13B being an a cross-section, and FIG. 13C being a b cross-section; the difference from the first embodiment shown in FIG. 2 lies in that a porous fluid resistance 18 is arranged between inlet port 5 and the header 4 provided on the opposite side of holes 3 to that of the heat sources.

By providing porous fluid resistance 18 between header 4 and inlet port 5, the flow issuing on the downstream side of porous fluid resistance 18 becomes uniform and the tendency for differences to arise in the flow rate flowing into holes 3 is reduced, so flow rate differences between holes can be made smaller and, just as in the case of the first embodiment, the heat conduction rate of the plurality of parts with which the flow collides becomes practically equal, so the cooling performance of the heat sink, with which the flow collides, at the back of the heat sources becomes practically uniform.

Next, a thirteenth embodiment of the present invention will be described with reference to FIG. 14. Description of parts which are the same as in the case of the first embodiment is omitted and only parts which are different are described.

Figure 14A:
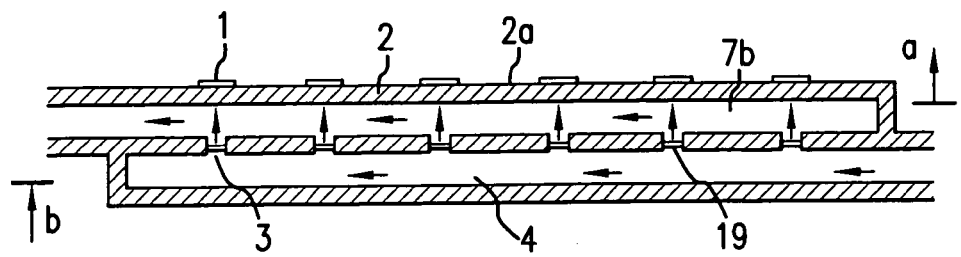
FIGS. 14A through 14C show cross-sectional views of a cooling device for a heat source according to a thirteenth embodiment of the present invention.
Figure 14B:
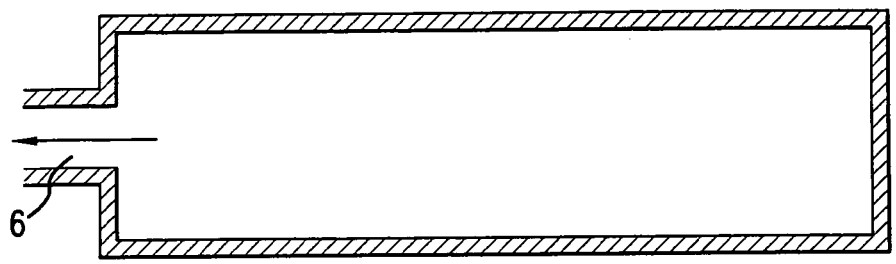
Figure 14C:
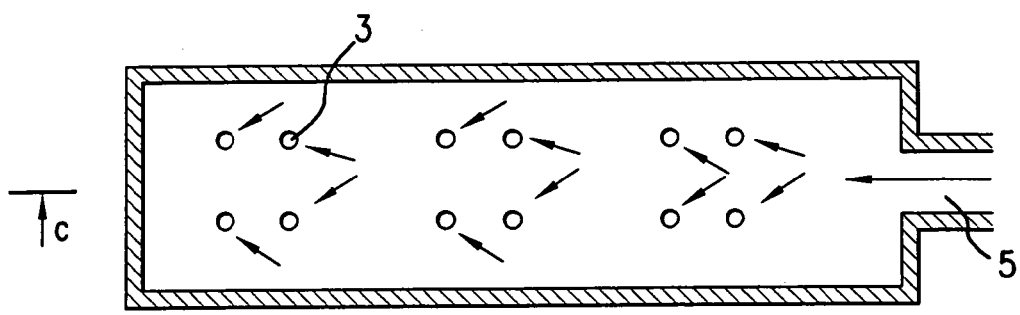

FIG. 14 shows cross-sectional views of a cooling device for a heat source according to a twelfth embodiment, FIG. 14A being a c cross-section, FIG. 14B being an a cross-section, and FIG. 14C being a b cross-section; the difference from the first embodiment shown in FIG. 2 lies in that a porous fluid resistance 19 is provided on the upstream side of holes 3.

By providing porous fluid resistance 19 on the upstream side of holes 3, the differences in pressure loss from inlet port 5 to porous fluid resistance 19 on the upstream side of the holes among the plurality of holes 3 becomes small and the outflow flow rate from holes 3 becomes practically uniform, making it possible to reduce flow rate differences between holes; just as in the case of the first embodiment, the heat conduction rate of the plurality of parts with which the flow collides becomes practically equal, so the cooling performance of the heat sink, with which the flow collides, at the back of the heat source becomes practically uniform.

Next, a fourteenth embodiment of the present invention will be described with reference to FIG. 15. Description of parts which are the same as in the case of the first embodiment is omitted and only parts which are different are described.

Figure 15A:
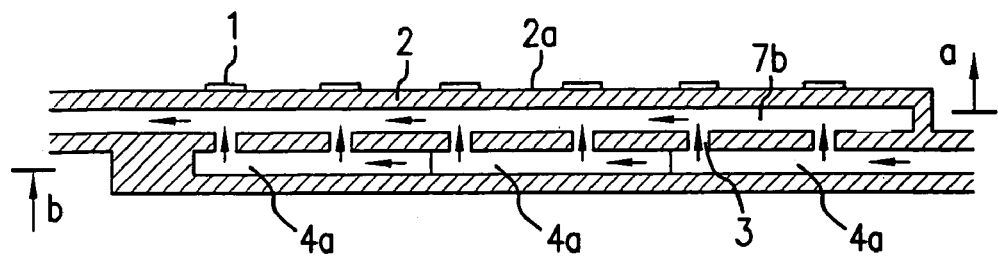
FIGS. 15A through 15C show cross-sectional views of a cooling device for a heat source according to a fourteenth embodiment of the present invention.
Figure 15B:
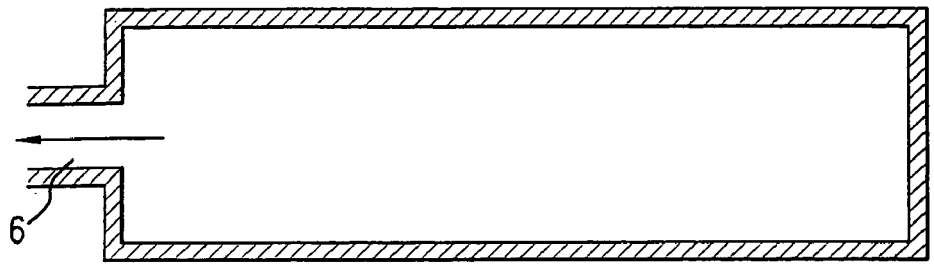
Figure 15C:
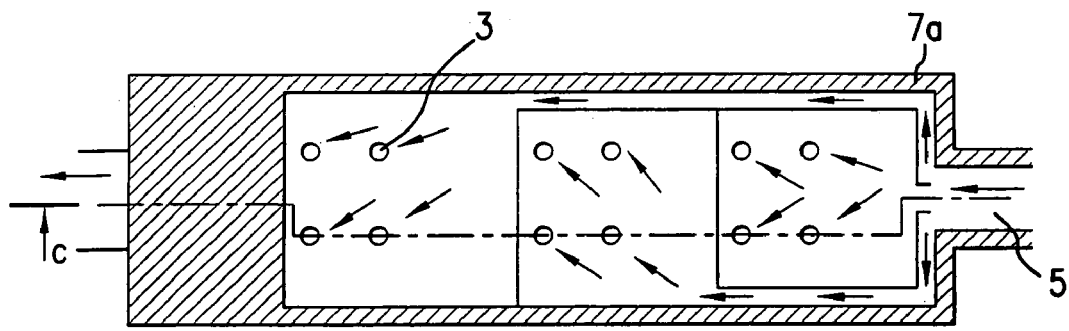

FIG. 15 shows cross-sectional views of a cooling device for a heat source according to a fourteenth embodiment, FIG. 15A being a c cross-section, FIG. 15B being an a cross-section, and FIG. 15C being a b cross-section; the difference from the first embodiment shown in FIG. 2 lies in that a plurality of headers 4a are arranged on the side of holes 3 opposite to that of the heat source.

The plurality of headers 4a are partitioned by partitions 9, flow from inlet port 5 to headers 4a being guided by inlet-side flow path 7a.

In this way, the fluid resistance of inlet-side flow path 7a to the respective headers is equalized, thereby reducing the difference of total flow rate of the respective headers. In this way, compared with the case where there is only a single header, the number of holes per header becomes fewer, so the differences of fluid resistance to the respective holes in a header becomes small, making it possible to reduce the flow rate differences between each hole; thus, just as in the case of the first embodiment, the heat conduction rate of the plurality of parts with which the flow collides becomes practically equal so the cooling performance of the heat sink, with which the flow collides, at the back of the heat sources becomes practically uniform.

Next, a fifteenth embodiment of the present invention will be described with reference to FIG. 16. Description of parts which are the same as in the case of the fourteenth embodiment is omitted and only parts which are different are described.

Figure 16:
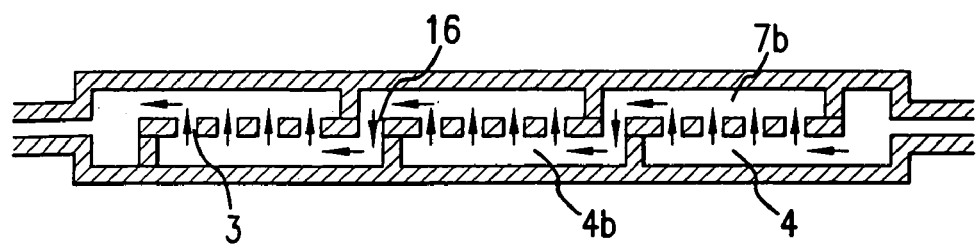
FIG. 16 shows a cross-sectional view of a cooling device for a heat source according to a fifteenth embodiment of the present invention.

FIG. 16 shows a cross-sectional view of a cooling device for a heat source according to a fifteenth embodiment; the difference from the fourteenth embodiment shown in FIG. 15 lies in that it is arranged that the fluid issuing from holes 3 passes through flow path 16 from outlet side flow path 7b, to be returned to another header 4b.

In this way, the number of holes per header is reduced and the difference of fluid resistance from the header inlet to the respective holes within a header thus becomes small, making it possible to reduce the differences of flow rate between the respective holes. In the same way as in the fourth embodiment, the heat conduction rate of the plurality of parts with which the flow collides thus becomes practically equal, so the cooling performance of the heat sink, with which the flow collides, at the back of the heat sources becomes practically uniform.

Next, a sixteenth embodiment of the present invention will be described with reference to FIG. 17. Description of parts which are the same as in the case of the first embodiment is omitted and only parts which are different are described.

Figure 17A:
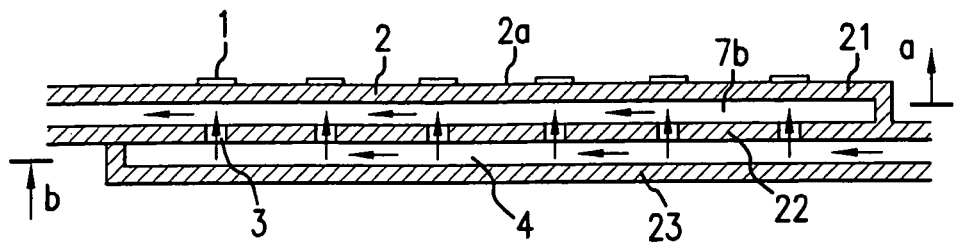
FIGS. 17A through 17C show cross-sectional views of a cooling device for a heat source according to a sixteenth embodiment of the present invention.
Figure 17B:
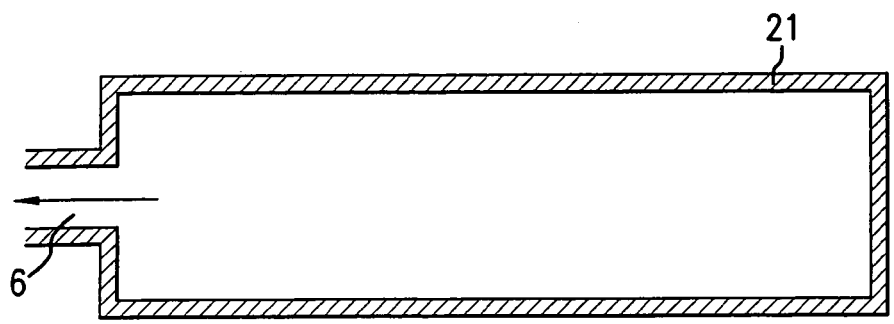
Figure 17C:
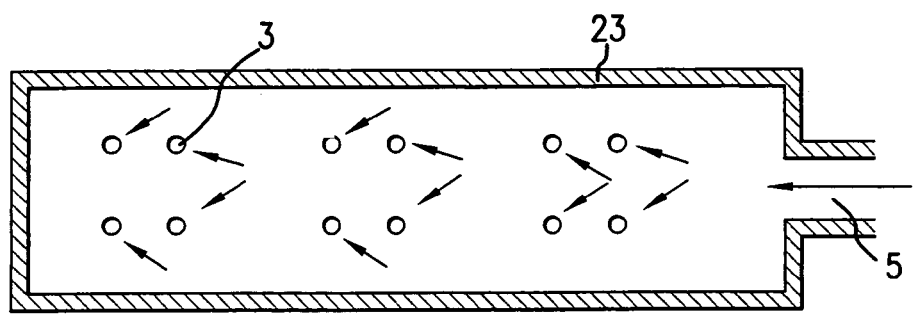

FIG. 17 shows cross-sectional views of a cooling device for a heat source according to a sixteenth embodiment, FIG. 17A being a c cross-section, FIG. 17B being an a cross-section, and FIG. 17C being a b cross-section; the difference from the first embodiment shown in FIG. 2 lies in that, whereas the cooling device for a heat source of the first embodiment was integrally formed, in this embodiment, the part 21 where heat sources 1 are arranged, the part 22 where holes 3 are arranged and the part 23 where header 4 is arranged are divided.

Thanks to such division, it becomes possible to easily change the position and hole diameter of holes 3 in accordance with the position of the heat sources and the size of the heat sources and the flow from holes 3 can thus be directed to the middle of the heat sources.

Since the heat conduction rate of the heat conduction of the colliding flow decreases as the distance from the jet stream is increased, by arranging holes 3 therebelow in accordance with the position of the heat sources, a high heat conduction rate at the locations of heat generation can be obtained and, just as in the case of the first embodiment, the heat conduction rate of the plurality of parts with which the flow collides thus becomes practically equal, so the cooling performance of the heat sink, with which the flow collides, at the back of the heat sources becomes practically uniform.

Figure 18:
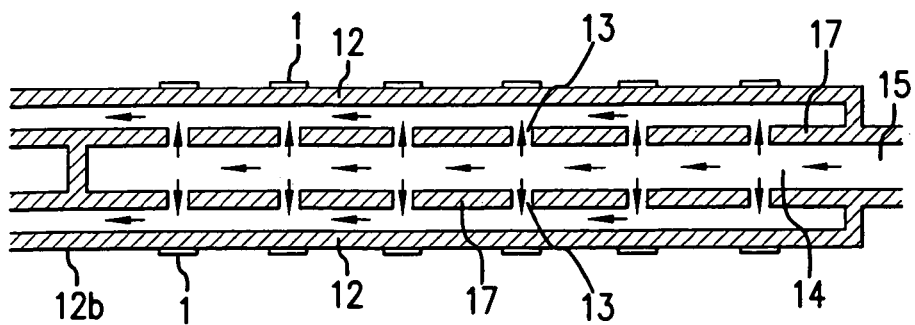
FIG. 18 shows a cross-sectional view of a cooling device for a heat source according to a seventeenth embodiment of the present invention.

FIG. 18 is a cross-sectional view of a cooling device for a heat source according to a seventeenth embodiment.

In FIG. 18, 1 are heat sources such as semiconductor elements, 12 is a heat sink, 13 are holes, 14 is a header and 15 is an inlet port, header 14 being constituted in the middle of heat sink 12 and respectively a single one or a plurality of holes 13 being provided in sidewalls 17 on both sides of the header.

The fluid flowing in from inlet port 15 passes through header 14 and passes out through holes 13 provided in walls 17 on both sides of the header. Thus the jet stream from holes 13 towards heat sources 1 arranged on the outer surfaces on both sides of the outside walls 12b of the heat sink collides therewith. The heat conduction rate of wall faces 12b is thereby increased, improving the cooling performance.

For example, if heat sources 1 of the same number are arranged with the same pitch in the direction of the fluid flow, by such an arrangement of heat sources 1 on both sides, the distance from the inflow port 15 to holes 13 can be shortened compared with the case where they are arranged on one side only; pressure loss can therefore be reduced.

As described in detail above, with the present invention, fluid resistance is reduced and pressure loss is reduced. Also, a cooling device for a heat source can be obtained wherein the heat conduction rate of the plurality of parts with which the flow collides is practically equal, so the cooling performance of the heat sink, with which the flow collides, at the back of the heat sources becomes practically uniform.

Obviously, numerous additional modifications and variations of the present invention are possible in light of the above teachings. It is therefore to be understood that within the scope of the appended claims, the present invention they be practiced otherwise than as specially described herein.

What is claimed is:

1. A cooling device for a heat source, comprising:
    (1) a heat sink including a coolant, said heat sink comprising:
        (a) a first heat sink member with a heat source arranged at an outer surface of said heat sink; and
        (b) a second heat sink member provided with a plurality of holes, said coolant that cools said heat source being made to pass through said holes, said second heat sink member having a first side, and a second side opposite to the first side;
    (2) a header disposed on said first side, said first heat sink member disposed on said second side, said header and said second heat sink member surrounding a first space, said first heat sink member and second heat sink member surrounding a second space, said first space disposed on said first side, said second space disposed on said second side;
    (3) an inlet port whereby said coolant is made to flow into said first space;
    (4) an outlet port whereby said coolant in said second space is made to flow out, said inlet port disposed adjacent said first space on said first side, said outlet port disposed on said second side;
    (5) a plurality of upright plates provided on a downstream side of said header in said first space, each of said plurality of upright plates disposed adjacent to and downstream of a separate one of a respective single one of the plurality of holes, the plates of the plurality of upright plates being separated from each other,
    wherein a gap between each of said upright plates and a wall face of said header on a side of said header opposite said holes is eliminated; and
    a plurality of baffle plates provided on an upstream side of said holes within said second space, each of said plurality of baffle plates disposed adjacent to and upstream of a separate one of a respective one of the plurality of holes,
    wherein each of said upright plates and said baffle plates respectively are made of an arcuate shape adjacent a respective hole of said plurality of holes, an arc of said arcuate shape being circumferentially around a respective hole.

2. The cooling device for a heat source according to claim 1, wherein the heat sink has a first sidewall and a second sidewall, and each of said baffle plates is disposed only partially across within said heat sink between said first sidewall and said second sidewall.

3. The cooling device for a heat source according to claim 1, wherein a gap between each baffle plate and a wall face of said first heat sink member on a side of said heat sink opposite said holes is eliminated.

* * * * *